United States Patent
Kondo

(10) Patent No.: US 8,422,531 B2
(45) Date of Patent: Apr. 16, 2013

(54) SURFACE EMITTING SEMICONDUCTOR LASER

(75) Inventor: Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 148 days.

(21) Appl. No.: 12/832,590

(22) Filed: Jul. 8, 2010

(65) Prior Publication Data

US 2011/0170568 A1 Jul. 14, 2011

(30) Foreign Application Priority Data

Jan. 8, 2010 (JP) ................................ 2010-002821

(51) Int. Cl.
*H01S 3/08* (2006.01)
*H01S 5/00* (2006.01)

(52) U.S. Cl.
USPC .............. 372/99; 372/43.01; 372/92; 372/98; 372/50.124

(58) Field of Classification Search ............ 372/50.124, 372/50.121, 92, 98–99
See application file for complete search history.

(56) References Cited

U.S. PATENT DOCUMENTS

| | | | |
|---|---|---|---|
| 5,351,256 A * | 9/1994 | Schneider et al. ....... | 372/45.011 |
| 2002/0150135 A1 * | 10/2002 | Naone et al. ................. | 372/45 |
| 2004/0208216 A1 * | 10/2004 | Naone et al. ................. | 372/45 |
| 2005/0089074 A1 | 4/2005 | Koelle et al. | |
| 2009/0135876 A1 * | 5/2009 | Takeuchi et al. .......... | 372/50.11 |

FOREIGN PATENT DOCUMENTS

JP    A-2005-129960    5/2005

OTHER PUBLICATIONS

Unold et al.; "Improving Single-Mode VCSEL Performance by Introducing a Long Monolithic Cavity;" *IEEE Photonics Technology Letters*; Aug. 2000; pp. 939-941; vol. 12, No. 8; IEEE.

Mahmoud et al.; "Analysis of longitudinal mode wave guiding in vertical-cavity surface-emitting lasers with long monolithic cavity;" *Applied Physics Letters*; Jan. 29, 2001; pp. 586-588; vol. 78, No. 5; American Institute of Physics.

* cited by examiner

*Primary Examiner* — Jessica Stultz
*Assistant Examiner* — Phillip Nguyen
(74) *Attorney, Agent, or Firm* — Oliff & Berridge, PLC

(57) ABSTRACT

A surface emitting semiconductor laser includes a substrate, an n-type lower DBR, an n-type cavity extending region formed on the lower DBR, an active region formed on the cavity extending region, and an upper DBR formed on the active region. A difference in refractive index between a relatively high refractive index layer and a relatively low refractive in the upper DBR is smaller than that in the lower DBR.

18 Claims, 10 Drawing Sheets

SURFACE EMITTING SEMICONDUCTOR LASER

CROSS-REFERENCE TO RELATED APPLICATION

This application is based on and claims priority under 35 USC 119 from Japanese Patent Application No. 2010-002821 filed on Jan. 8, 2010.

BACKGROUND (i) Technical Field

The present invention relates to a surface emitting semiconductor laser, a surface emitting semiconductor laser device, an optical transmission device and an information processing apparatus.

(ii) Related Art

A surface emitting semiconductor laser, which is typically a vertical cavity surface emitting laser: VCSEL), is utilized as an optical source in a communication device and an image forming apparatus. The VCSEL used as the optical source is required to have improved optical output and electro static discharge (ESD) in the single transverse mode and to have lengthened life by reducing the resistance and heat radiation performance.

The single transverse mode of selective oxidation type VCSEL may be realized by reducing the diameter of the oxide aperture of the current confining layer to about 3 micron. As the oxide aperture diameter reduces, the resistance of the laser increases and the heat generation temperature rises, so that life may be shortened. Further, a reduced oxide aperture diameter results in a reduced optical output. An increased cavity length may be a solution to realize higher optical output and longer life of VCSEL. A VCSEL having an increased cavity length has a cavity that may be typically defined by lengthening the cavity by 3 to 4 µm (approximately equal to ten to twenty times the oscillation wavelength). The increased cavity length increases the difference in optical loss between the primary transverse mode having a small divergence angle and a high-order transverse mode having a large divergence angle. Thus, the single transverse mode may be realized even using an increased oxide aperture diameter. In the VCSEL with the long cavity, the oxide aperture diameter may be increased up to about 8 µm, and the optical output may be increased up to about 5 mW.

SUMMARY

According to an aspect of the present invention, there is provided a surface emitting semiconductor laser including: a substrate; a first semiconductor multilayer reflector of a first conduction type that is formed on the substrate and is composed of stacked pairs of relatively high refractive index layers and relatively low refractive index layers; a cavity extending region formed on the first semiconductor multilayer reflector; an active region formed on the cavity extending region; and a second semiconductor multilayer reflector of a second conduction type that is formed on the active region and is composed of stacked pairs of relatively high refractive index layers and relatively low refractive index layers, wherein: a cavity including the cavity extending region and the active region has a length greater than an oscillation wavelength, and at least two resonance wavelengths are included in a reflection band of the cavity; a difference in refractive index between the relatively high refractive index layers and the relatively low refractive index layers of one of the first and second semiconductor multilayer reflectors that has a smaller reflectance at the at least two resonance wavelengths is smaller than that in refractive index between the relatively high refractive index layers and the relatively low refractive index layers of another one of the first and second semiconductor multilayer reflectors that has a greater reflectance; and the reflectance at a desired one of the at least two resonance wavelengths of said one of the first and second semiconductor multilayer reflector is equal to or greater than 99% and the reflectance at a remaining another resonance wavelength thereof is less than 99%.

BRIEF DESCRIPTION OF THE DRAWINGS

Exemplary embodiments of the present invention will be described in detail based on the following figures, wherein.

DETAILED DESCRIPTION

A description will now be given of exemplary embodiments of the present invention with reference to the accompanying drawings. In the following, surface emitting semiconductor lasers of selective oxidation type will be discussed and such lasers will now be referred to as VCSELs. The dimensions of VCSELs illustrated may be emphasized for the purpose of facilitating better understanding and may be different from the actual dimensions thereof.

Figure 1A:
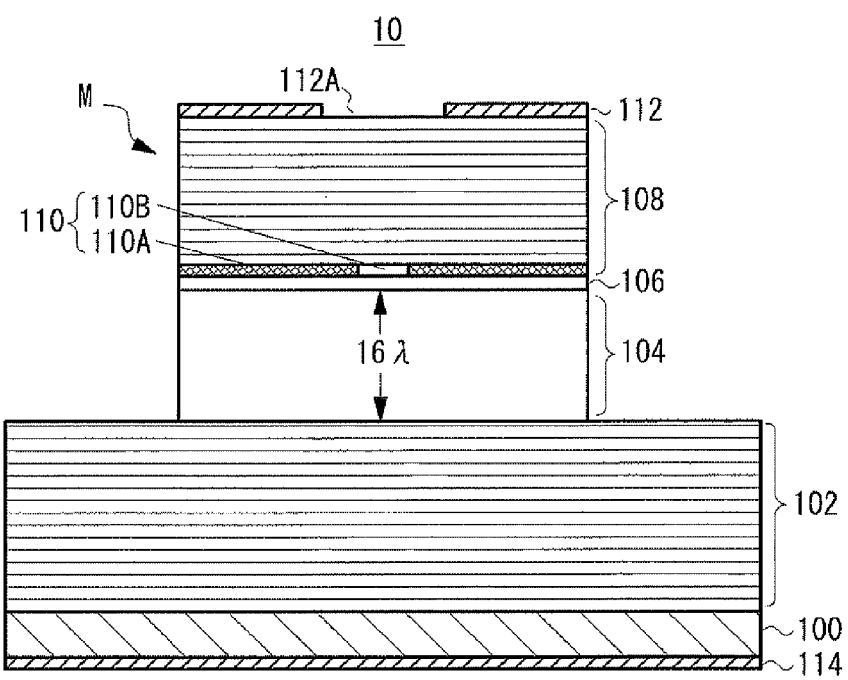
FIG. 1A is a cross-sectional view of a VCSEL with an extended cavity in accordance with a first exemplary embodiment of the present invention.

FIG. 1A is a cross-sectional view of a VCSEL in accordance with a first exemplary embodiment. Referring to FIG. 1A, a VCSEL 10 of the present exemplary embodiment has an n-type GaAs substrate 100, on which the following layers are stacked. An n-type distributed Bragg reflector (DBR) 102 formed by alternately stacking AlGaAs layers having different Al compositions is stacked on the n-type GaAs substrate 100. A cavity extending region 104 that extends a cavity length is formed on the lower DBR 102. An active region 106 is formed on the cavity extending region 104. The active region 106 includes a quantum well layer sandwiched between upper and lower spacer layers. A p-type upper DBR 108 formed by alternately stacking AlGaAs layers having different Al compositions is stacked on the active region 106.

The n-type lower DBR 102 has a multilayer structure composed of multiple pairs, each of which is composed of an Al0.9Ga0.1As layer and an Al0.3Ga0.7As layer. Each of the two different AlGaAs layers is $\lambda/4n_r$ thick where $\lambda$ is the oscillation wavelength, and $n_r$ is the refractive index of the medium. The alternate stacking may be repeated with a period of 40. The carrier concentration after doping with silicon, which is an n-type impurity, may be $3\times10^{18}$ cm$^{-3}$, for example.

The VCSEL 10 has an extended cavity structure, which may be realized with the cavity extending region 104 provided on the lower DBR 102. A cavity is defined so as to include the cavity extending region 104 and the active region 106. The cavity extending region 104 has a thickness of about 3 to 4 μm, and has an optical thickness of 16$\lambda$ where $\lambda$ is the oscillation wavelength. The ordinary VCSELs are not equipped with the cavity extending region 104 and are configured to form the active region 106 on the lower DBR 102. The cavity extending region 104 may be referred to as a cavity extending region or a cavity space.

The cavity extending region 104 is a monolithic layer formed by epitaxial growth. Thus, the cavity extending region 104 may be made of a material such as AlGaAs, GaAs or AlAs, which has the same lattice constant as the GaAs substrate 100 or a lattice constant that matches that of the GaAs substrate 100. In a case where the cavity extending region 104 is made of AlGaAs, the Al composition thereof is selected within the range of 0.3 to 0.9 of the Al composition of the lower DBR 102. In other words, the refractive index of the cavity extending region 104 is between the high refractive index of the high-refractive-index layers of the lower DBR 102 having a low Al composition and the low refractive index of the low-refractive-index layers thereof having a high Al composition. Preferably, the cavity extending region 104 is of n type in order to reduce the electrical resistance of the laser. However, the cavity extending region 104 may have a reduced impurity concentration for suppressing absorption of light by the impurity or may be of i type (intrinsic semiconductor) with no impurity being implanted. For the cavity extending region 104 of i type, the carrier is implanted in the active region by the electric field drift.

The active region 106 may be configured as follows. The lower spacer layer of the active region 106 may be an undoped Al$_{0.6}$Ga$_{0.4}$As layer. The quantum well active layer may be an undoped Al$_{0.11}$Ga$_{0.89}$As quantum well layer and an undoped Al$_{0.3}$Ga$_{0.7}$As barrier layer. The upper spacer layer may be an undoped Al$_{0.6}$Ga$_{0.4}$As layer.

The p-type upper DBR 108 has a multilayer structure formed by alternately stacking an Al0.9Ga0.1As layer and an Al0.4Ga0.6As layer by 29 periods. Each layer may be $\lambda/4n_r$ thick. The carrier concentration after doping with carbon that is a p-type impurity may be $3\times10^{18}$ cm$^{-3}$, for example. Preferably, a contact layer formed by p-type GaAs is formed on the uppermost layer of the upper DBR 108. A current confining layer 110 may be formed in the lowermost layer of the upper DBR 108 or an inner layer thereof. As will be described later, the upper DBR 108 differs from the lower DBR 102 in that one of each pair of AlGaAs layers has a different Al composition.

A cylindrical mesa (post structure) M may be defined on the GaAs substrate 100 by etching the semiconductor layers from the upper DBR 108 to the lower DBR 102. The current confining layer 110 is exposed to the side surface of the mesa M and has an oxidized region 110A defined by selectively oxidizing the mesa M from its side surface, and an electrically conductive region (oxide aperture) 110B surrounded by the oxidized region 110A. In the oxidizing process for the VCSEL, the rate of oxidizing the AlAs layer is higher than that of oxidizing the AlGaAs layer, and the oxidized region 110A is oxidized towards the inside of the mesa M from the side surface thereof at an almost constant rate. Thus, the planar shape of the conductive region 110B parallel to the main surface of the GaAs substrate 100 has a circular shape that reflects the outer shape of the mesa M, and the center of the conductive region 110B is aligned with the optical axis corresponding to the axial direction of the mesa M. In order to obtain the primary transverse mode, the VCSEL 10 with the extended cavity may be configured to have a greater diameter of the conductive region 110B than that of the ordinary VCSEL. For example, the diameter of the conductive region 110B may be increased up to 7 to 8 μm.

The uppermost layer of the mesa M is a p-side electrode 112, which has a ring shape, and is made of a metal such as a laminate of Ti/Au. The p-side electrode 112 is in ohmic contact with the contact layer of the upper DBR 108. A light emission aperture 112A having a circular shape is formed in the p-side electrode 112. The center of the light emission aperture 112A is aligned with the optical axis of the mesa M. An n-side electrode 114 is formed on a back surface of the GaAs substrate 100.

Figure 2A:
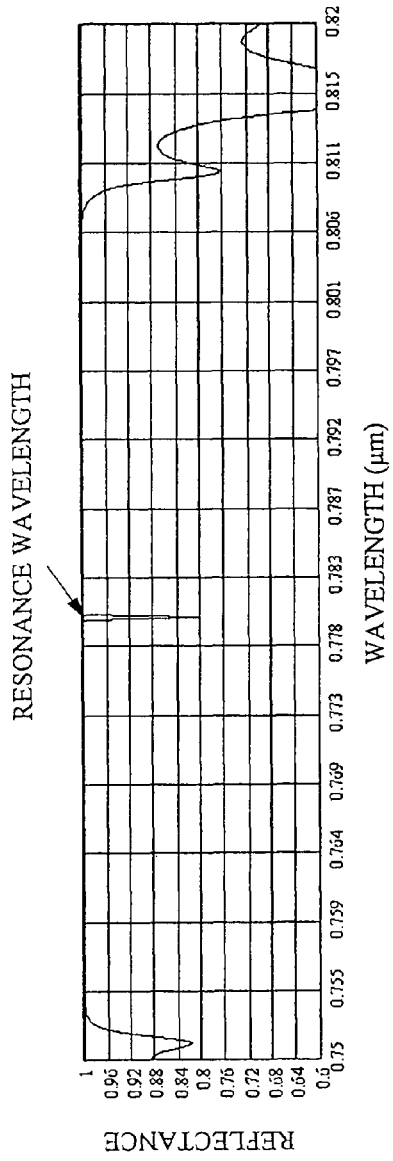
FIG. 2A is a graph illustrating a relation between the reflectance and the wavelength in an ordinary VCSEL.
Figure 2B:
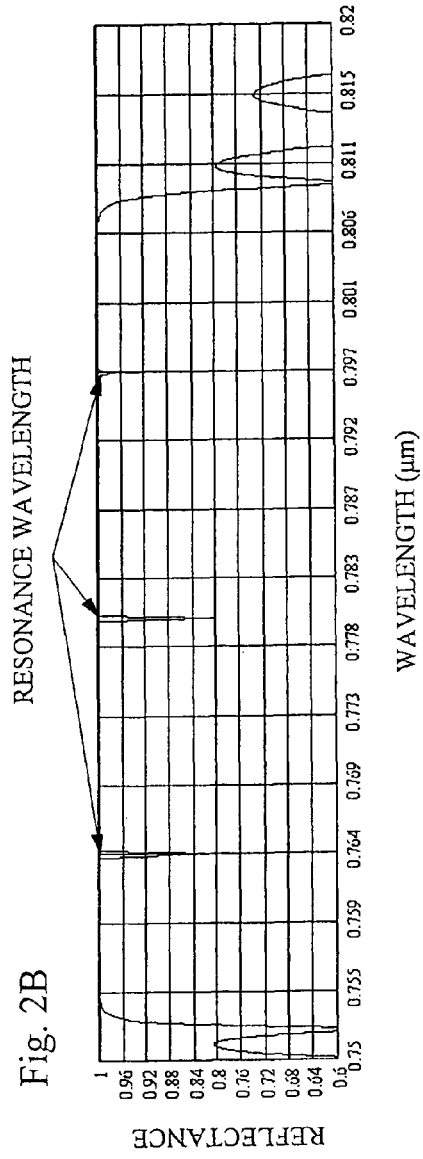
FIG. 2B is a graph illustrating a relation between the reflectance and the wavelength in the VCSEL with an extended cavity.
Figure 3A:
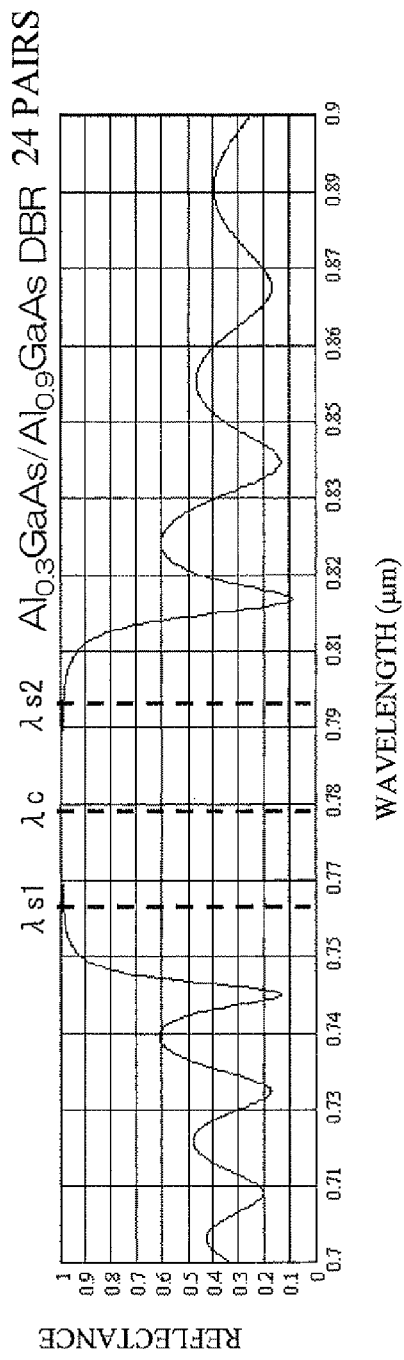
FIGS. 3A and 3B are graphs illustrating a relation between a reflection band and a difference in refractive index.
Figure 3B:
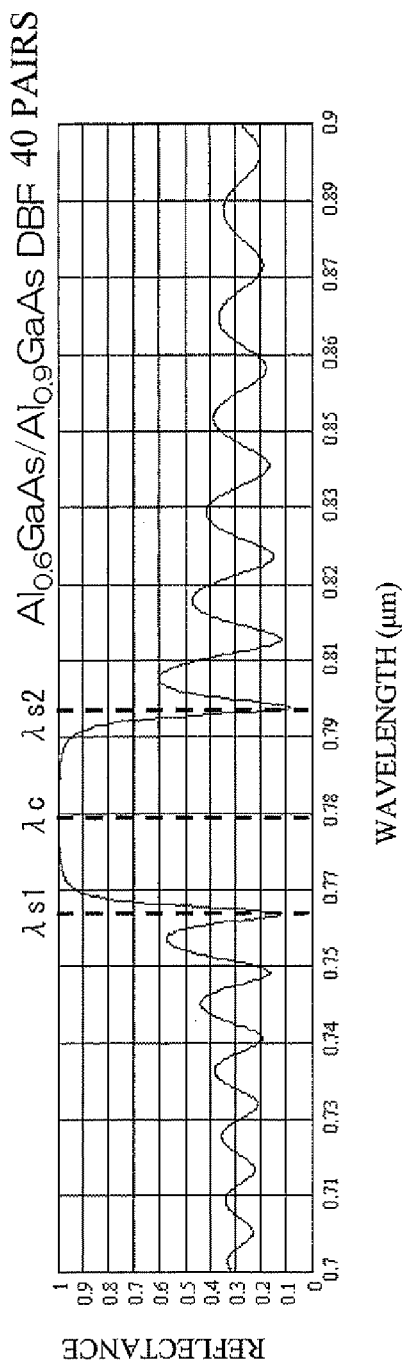
Figure 4A:
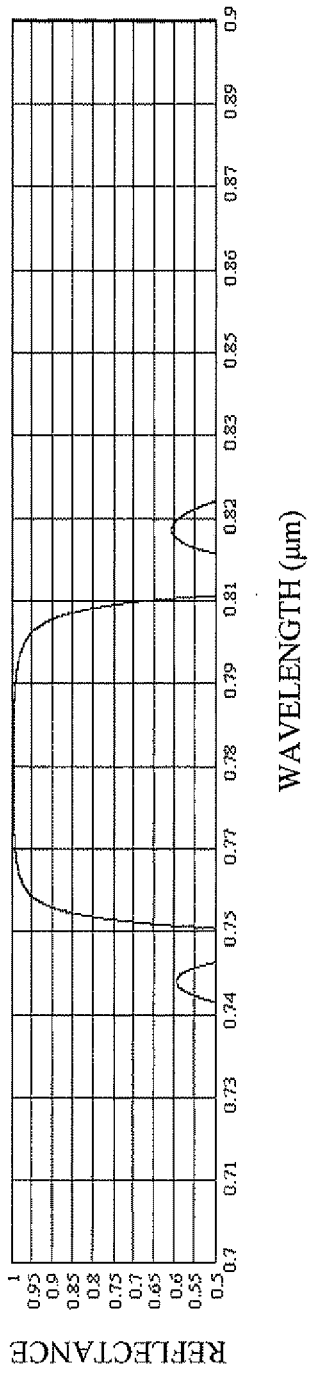
FIG. 4A is a graph illustrating a relation between the reflection band and the resonance wavelength in an upper DBR of the VCSEL in accordance with the first exemplary embodiment.
Figure 4B:
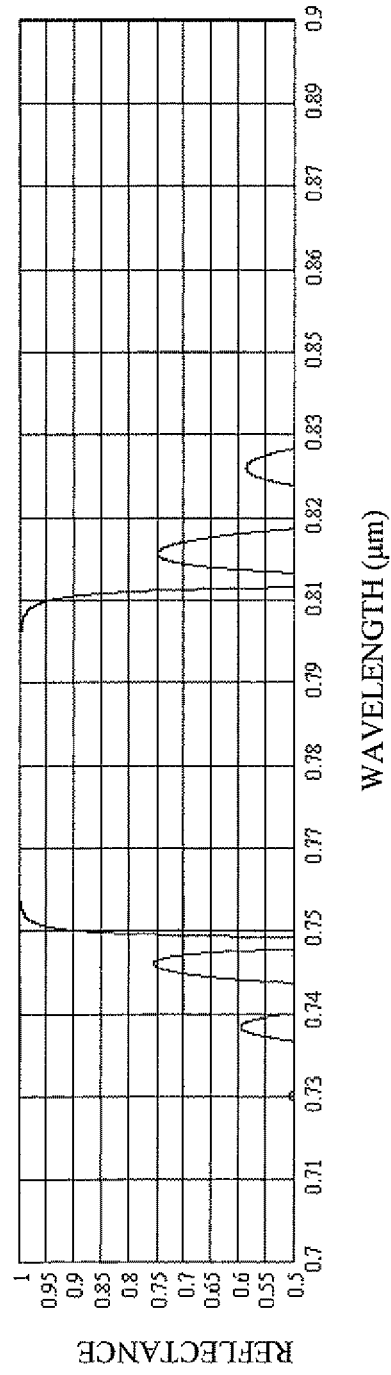
FIG. 4B is a graph illustrating a relation between the reflection band and the resonance wavelength in a lower DBR of the VCSEL in accordance with the first exemplary embodiment.

A further description will now be given of the VCSEL with the extended cavity in accordance with the first exemplary embodiment. FIG. 2A is a graph of a refractive index vs. wavelength characteristic of an ordinary VCSEL, and FIG. 2B is a graph of a refractive index vs. wavelength characteristic of the VCSEL with an extended cavity. FIGS. 3A and 3B are graphs that illustrate relations between a difference in the refractive index of DBR (a difference in the Al composition) and the reflection band. FIGS. 4A and 4B are graphs that illustrate relations between the reflection bands of the upper and lower DBRs of the VCSEL with the extended cavity in accordance with the first exemplary embodiment and the reflection band. The graphs of these figures are obtained by calculation using reflection profiles of pairs of layers that form the DBRs.

The graph of FIG. 2A indicates the reflection band of the DBRs of the ordinary VCSEL that does not have the cavity extending region 104. The vertical axis of FIG. 2A is the refractive index, and the horizontal axis thereof is the wavelength. When the ordinary VCSEL operates in the single transverse mode, the ordinary VCSEL has a single resonance wavelength, namely, a single longitudinal mode because the cavity length is small. In the VCSEL illustrated, there is a resonance wavelength of about 780 nm. The graph of FIG. 2B illustrates resonance wavelengths of the DBRs of the VCSEL with the extended cavity. In the VCSEL with the extended cavity, multiple resonance wavelengths occur due to the increased cavity length, and the number of resonance wavelengths that occur is proportional to the cavity length. In the example illustrated, there are three resonance wavelengths of about 760 nm, 780 nm and 797 nm. Thus, in the VCSEL with the extended cavity, switching of the resonance wavelength (switching of the longitudinal mode) is liable to take place due to variation in the operation current, and a kink may occur in the IL characteristic. Further, switching of the wavelength is not suitable for high-speed modulation of VCSEL.

FIG. 3A illustrates a reflection band obtained for a DBR formed by stacking 24 pairs of $Al_{0.3}Ga_{0.7}As$ layers and $Al_{0.9}Ga_{0.1}As$ layers, FIG. 3B illustrates a reflection band obtained for a DBR formed by stacking 47 pairs of $Al_{0.6}Ga_{0.4}As$ layers and $Al_{0.9}G_{0.1}As$ layers. The DBR illustrated in FIG. 3A has a greater difference in the refractive index between the two different AlGaAs layers than that in FIG. 3B (a greater difference in the Al composition), and the reflectance of the DBR in FIG. 3A is greater than about 95% in a wide band from 750 nm to 810 nm. In the range over 95%, there are three resonance wavelengths $\lambda s1$, $\lambda c$ and $\lambda s2$ located at positions indicated by broken lines. However, it is to be noted that a reflectance of at least 99% is needed for the cavity of VCSEL. The DBR illustrated in FIG. 3B has a smaller difference in the refractive index than that in FIG. 3A, and the reflectance over about 95% ranges from 770 nm to 790 nm. That is, the reflection band in FIG. 38 is narrower than that in FIG. 3A.

The graph of FIG. 4A illustrates a reflection band of the p-type upper DBR 108 of the VCSEL illustrated in FIG. 1, and the graph of FIG. 4B illustrates a reflection band of the n-type lower DBR 102 thereof. The upper DBR 108 is configured so that the two AlGaAs layers of each pair have Al compositions of 40% and 90%. The lower DBR 102 is configured so that the two AlGaAs layers of each pair have Al compositions of 30% and 90%. The difference in the refractive index of the pairs of the upper DBR 108 is smaller than that in the refractive index of the pairs of the lower DBR 102. Thus, in the upper DBR 108, the band in which the refractive index exceeds about 99% and is usable as the cavity is available from about 770 nm to 790 nm, and is narrower than the band of the refractive index of the lower DBR 102 (about 760 nm to 800 nm). As described above, according to the present exemplary embodiment, the reflection band of the upper DBR 108, usable as the cavity is made narrower than that of the lower DBR 102, so that switching of the longitudinal mode that is specific to the VCSEL with the extended cavity can be suppressed.

When the DBR as illustrated in FIG. 3A is used as the upper DBR of the VCSEL with the extended cavity, the resonance wavelength $\lambda c$ is located at almost the center between the side resonance wavelengths $\lambda s1$ and $\lambda s2$. The difference in the spectrum wavelength between the central resonance wavelength $\lambda c$ and the side resonance wavelengths $\lambda s1$ and $\lambda s2$ is equal to 16.34 nm. The difference between the reflectance Rc of the central resonance wavelength $\lambda c$ and the reflectance Rs of the side resonance wavelengths $\lambda s1$ and $\lambda s2$ (Rc−Rs) is equal to 0.62%.

In the VCSEL 10 with the extended cavity of the first exemplary embodiment, the upper DBR 108 has a smaller difference in the refractive index than that of the upper DBR illustrated in FIG. 3A, and the difference in the spectrum wavelength between the central resonance wavelength $\lambda c$ and the side resonance wavelengths $\lambda s1$ and $\lambda s2$ is equal to 15.98 nm. Further, the difference between the reflectance Rc of the central resonance wavelength $\lambda c$ and the reflectance Rs of the side resonance wavelengths $\lambda s1$ and $\lambda s2$ (Rc−Rs) is equal to 1.01%, and is almost twice that of the DBR illustrated in FIG. 3A. If the reflectance Rc of the central wavelength is 99.7%, the reflectance of the side wavelengths is 98.7%, which is too low to enlarge the light at the side resonance wavelength. Thus, the side resonance wavelength may be suppressed. As the gain difference between the central wavelength and the side wavelengths increases, switching to the side wavelengths may be suppressed more effectively. The upper DBR 108 is configured to have an increased number of pairs of 29 in order to set the reflectance Rc of the central resonance wavelength $\lambda c$ almost equal to that of the DBR illustrated in FIG. 3A.

Next, the VCSEL with the extended cavity configured according to the first exemplary embodiment will be compared with a VCSEL configured so that both the reflectance of the central resonance wavelength $\lambda c$ and that of the side resonance wavelengths $\lambda s1$ and $\lambda s2$ extend 99%. Assuming that the n-side reflectance at the wavelength in the central longitudinal modes is 99.87% and the p-side reflectance is 99.21%, the threshold current in the central longitudinal mode is 0.616 mA and the threshold current in the side longitudinal mode is 0.85 mA in the case of a three-layer quantum well structure. Thus, a great difference between the threshold currents do not occur and switching to the side longitudinal mode may take place.

In contrast, the VCSEL of the present exemplary embodiment is configured to select the Al composition of one of the DBRs so that the reflectance values of the wavelengths in the side longitudinal modes is less than 99%, as has been described previously. For example, assuming that the reflectance values in the side longitudinal modes are 98% and 97%, the threshold currents are 1.896 mA and 3.768 mA, and are equal to or greater than about three time and six times the threshold current (0.616 mA) of the center longitudinal mode, respectively. These values are the thresholds for enabling the individual modes to oscillate independently. In the state in which the center longitudinal mode oscillates, the carrier concentration is theoretically equal to or greater than the threshold value and is constant. In actuality, the carrier concentration increases gradually. Thus, the above-described large differences may make it difficult to cause oscillation in the side longitudinal modes to take place.

Figure 5:
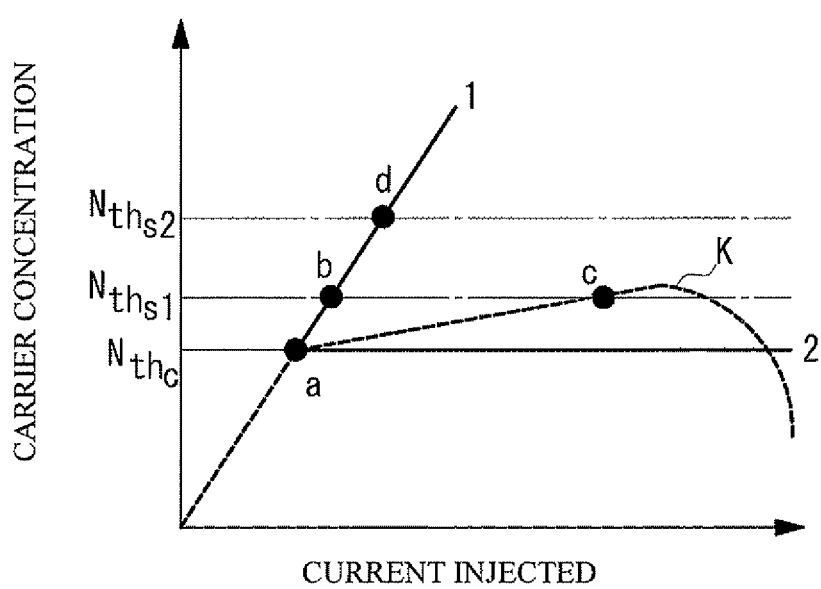
FIG. 5 is a graph that describes a phenomenon in which oscillation is suppressed when the reflectance at the resonance wavelength in a side longitudinal mode.

A further description will be given with reference to FIG. 5, which illustrates increase of carrier in the quantum well when current is injected in the VCSEL. The horizontal axis of FIG. 5 is the current injected, and the vertical axis thereof is the carrier concentration. As the current is injected, the carrier concentration increases linearly. Then, the laser oscillation stops when the carrier concentration becomes equal to Nthc (point a). Theoretically, the carrier concentration may be clamped at point a if influence of heat is not considered, as indicated by a solid line 2. However, in actuality, the carrier concentration continues to increase although such increase is slight. Then, overflow of carrier due to heat becomes conspicuous, and the carrier concentration decreases. Now, some symbols are defined so that Nthc is a threshold carrier concentration at a desired resonance wavelength $\lambda c$ (center longitudinal mode), and Nths1 and Nths2 are threshold concentrations in the side longitudinal modes. The threshold carrier concentrations are a function of reflectance, and increases as the reflectance decreases. The symbol Nths1 is the threshold carrier concentration of the side longitudinal mode of the VCSEL with the conventional extended cavity. A solid line 1 indicates an increase in the carrier concentration observed when no oscillation takes place in the center longitudinal mode. A point b indicates a threshold current for enabling first oscillation in the side longitudinal mode. However, in actuality, oscillation takes place first in the center longitudinal mode. Thus, the condition for oscillation in the side longitudinal mode has an increased injection current available at a point c. At the point c, the condition for oscillation in the side longitudinal mode is satisfied, and switching of the longitudinal mode may take place.

In the present exemplary embodiment, the reflectance values in the side longitudinal modes are reduced to less than 99%. Thus, the threshold carrier concentrations in the side longitudinal modes are Nths2. If oscillation in the center longitudinal mode does not take place, oscillation at a pond d on the solid line 1 may be enabled. However, in actuality, oscillation takes place first in the center longitudinal mode. Since a broken line K does not increase up to Nths2 at that time, oscillation in the side longitudinal mode is not caused and switching does not occur. The threshold currents in the side longitudinal mode are located at the points b and d, and are greatly increased or are not present under the condition for oscillation in the center longitudinal mode.

Figure 1B:
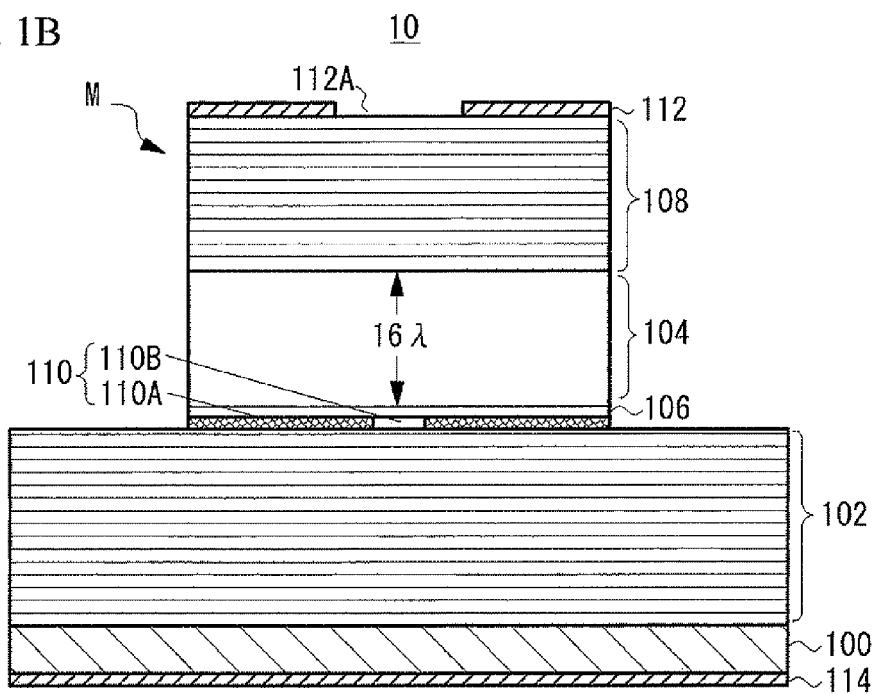
FIG. 1B is a cross-sectional view of a VCSEL with an extended cavity in accordance with a variation of the first exemplary embodiment.

A variation of the first exemplary embodiment of the present invention is illustrated in FIG. 1B. The variation differs from the first exemplary embodiment in that a VCSEL illustrated in FIG. 1B employs a p-type GaAs substrate. The VCSEL 10 illustrated in FIG. 1B has a p-type GaAs substrate 100 on which the following layers are stacked. A p-type lower DBR 102 formed by alternately stacking an $Al_{0.9}Ga_{0.1}As$ layer and an $Al_{0.3}Ga_{0.7}As$ layer by 40 pairs (periods) is stacked on the GaAs substrate 100. An active region 106 is formed on the lower DBR 102. A cavity extending region 104, which may be made of, for example, AlGaAs, GaAs or AlAs, is formed on the active region 106. An n-type upper DBR 108 formed by alternately stacking $Al_{0.9}Ga_{0.1}As$ layer and an $Al_{0.4}Ga_{0.6}As$ layer by 29 pairs (periods) is stacked on the cavity extending region 104. A current confining layer 110 is formed in the uppermost layer of the lower DBR 102 or is located close to the active region 106. A mesa M reaches at least the current confining layer 110.

Figure 6A:
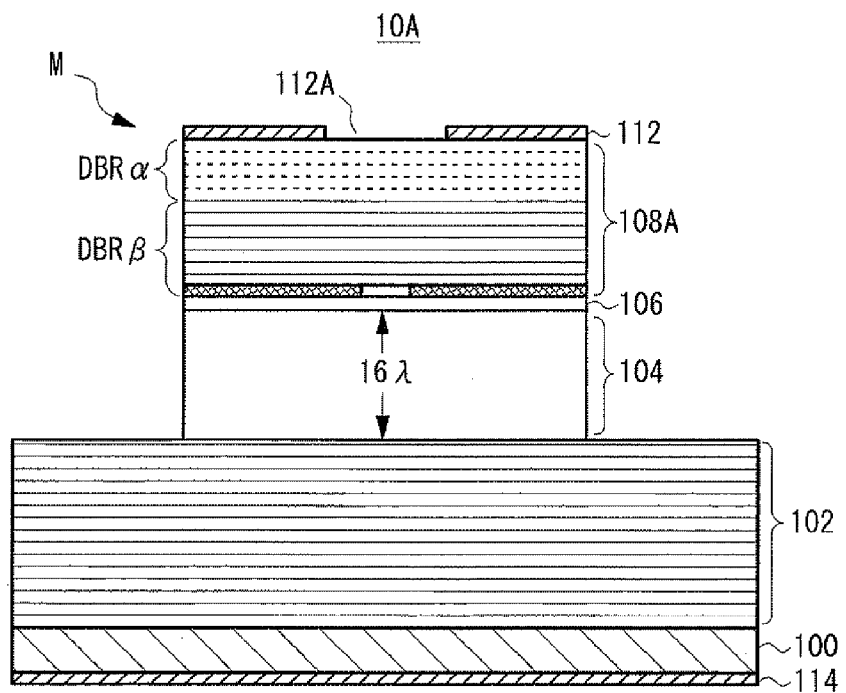
FIG. 6A is a cross-sectional view of a VCSEL with an extended cavity in accordance with a second exemplary embodiment of the present invention.

A description will now be given of a second exemplary embodiment of the present invention. FIG. 6A is a cross-sectional view of a VCSEL 10A in accordance with the second exemplary embodiment. The VCSEL of the second exemplary embodiment differs from that of the first exemplary embodiment in that the VCSEL 10A is equipped with an upper DBR 108A composed of a first p-type DBR α having a first difference in the refractive index between the paired layers and a second p-type DBR β having a second difference in the refractive index between the paired layers so that the first and second differences are different from each other. The first DBR α may have pairs of $Al_{0.6}Ga_{0.4}As$ layers and $Al_{0.9}Ga_{0.1}As$ layers by 10 periods, and the second DBR β may have pairs of $Al_{0.3}Ga_{0.7}As$ layers and $Al_{0.9}Ga_{0.1}As$ layers by 19 periods. The difference between the high refractive index layer and the low refractive index layer of the first DBR α is less than that between high refractive index layer and the low refractive index layer of the second DBR β. Like the first exemplary embodiment, the current confining layer 110 is formed in the lowermost layer of the second DBR β or is located close to the active region 106. A p-type GaAs contact layer is formed on the uppermost layer of the first DBR α.

Figure 7:
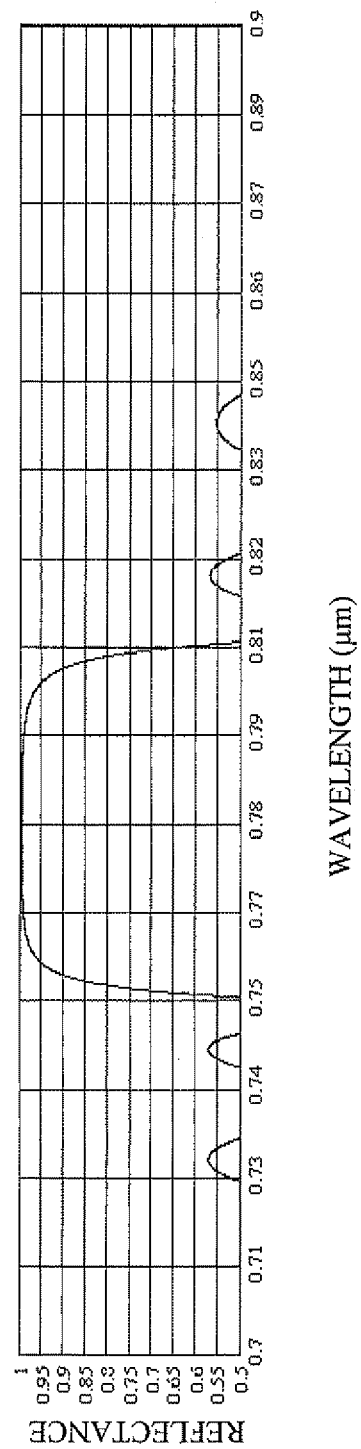
FIG. 7 is a graph that illustrates the reflection band of the upper DBR of the VCSEL configured according to the second exemplary embodiment.

FIG. 7 illustrates the reflection bands of the upper DBR 108A including the first DBR α and the second DBR β. The spectrum wavelength difference between the center resonance wavelength λc of the upper DBR 108A and the resonance wavelengths of the side resonance wavelengths λs1 and λs2 is equal to 16.2 nm. This value is greater than the wavelength difference in the first exemplary embodiment and is approximately equal to the spectrum wavelength difference (16.34 nm) of the DBR illustrated in FIG. 3A. The difference between the reflectance Rc of the central resonance wavelength λc and the reflectance Rs of the side resonance wavelengths λs1 and λs2 (Rc−Rs) is equal to 1.15%.

Since the first exemplary embodiment has a small difference in the refractive index between the paired layers of the upper DBR 108, the first exemplary embodiment has a small capability of confining light and a long effective length of the cavity. Thus, the spectrum wavelength difference between the center resonance wavelength λc and the side resonance wavelengths λs1 and λs2 is reduced and the gain difference is reduced. Thus, switching of the longitudinal mode is liable to occur. In contrast, the second exemplary embodiment is configured so that the difference in the refractive index between the paired layers of the first DBR α is made smaller than that in the refractive index between the paired layers of the second DBR β. It is thus possible to increase the spectrum wavelength differences between the center resonance wavelength λc and the side resonance wavelengths λs1 and λs2 and to maintain the difference in the reflectance (Rc−Rs) at 1.15%. It is thus possible to suppress the gain of the side resonance wavelengths λs1 and λs2 and to make it difficult to switch to these wavelengths.

Figure 6B:
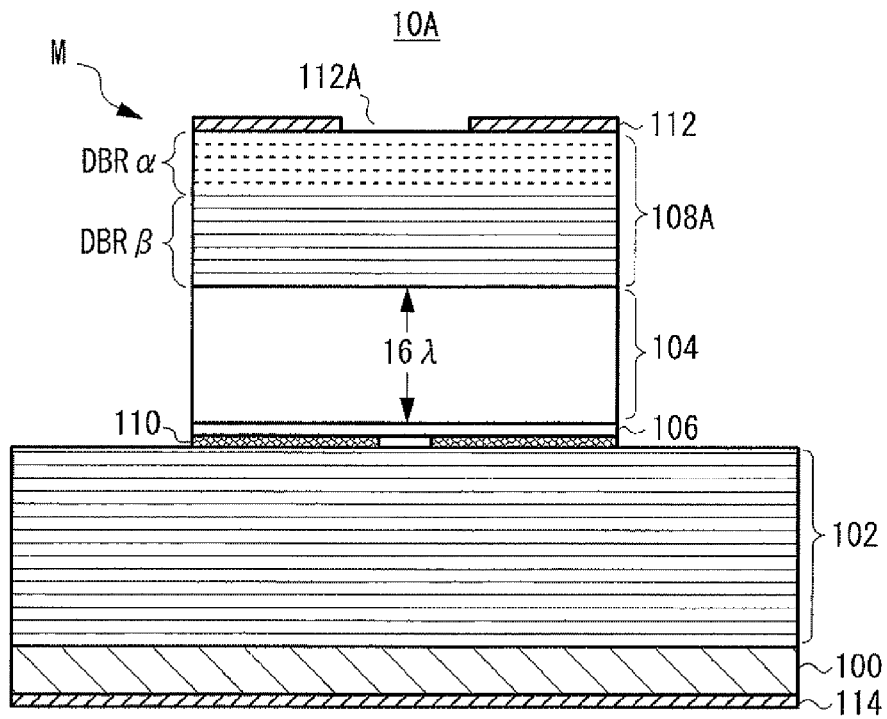
FIG. 6B is a cross-sectional view of a VCSEL with an extended cavity in accordance with a variation of the second exemplary embodiment of the present invention.

FIG. 6B illustrates a variation of the second exemplary embodiment of the present invention. The VCSEL 10A illustrated in FIG. 6B differs from the VCSEL illustrated in FIG. 6A in that the VCSEL 10A employs a p-type GaAs substrate 100 on which the following layers are stacked. A p-type lower DBR 102 formed by alternately stacking an $Al_{0.9}Ga_{0.1}As$ layer and an $Al_{0.3}Ga_{0.7}As$ layer by 40 pairs is stacked on the GaAs substrate 100. An active region 106 is formed on the lower DBR 102. A cavity extending region 104, which may be made of, for example, AlGaAs, GaAs or AlAs, is formed on the active region 106. An upper DBR 108A is provided on the cavity extending region 104. The upper DBR 108A is composed of a first DBR α of n type and a second DBR β of n type. The second DBR β is provided on the cavity extending region 104, and is formed by alternately stacking an $Al_{0.3}Ga_{0.7}As$ layer and an $Al_{0.9}Ga_{0.1}As$ layer by 19 periods. The first DBR α is provided on the second DBR β and is formed by alternately stacking an $Al_{0.6}Ga_{0.4}As$ layer and an $Al_{0.9}Ga_{0.1}As$ layer by 10 periods. A current confining layer 110 is formed in the uppermost layer of the lower DBR 102 or is located close to the active region 106.

A third exemplary embodiment of the present invention is now described. The VCSEL with the extended cavity may be configured so that the active region 106 has three quantum well layers or more in order to easily realize high power. In contrast, the third exemplary embodiment is preferably configured to have less than three quantum wells, namely, one or two quantum wells in order to suppress the resonance wavelengths λs1 and λs2 of the side longitudinal mode.

Figure 8:
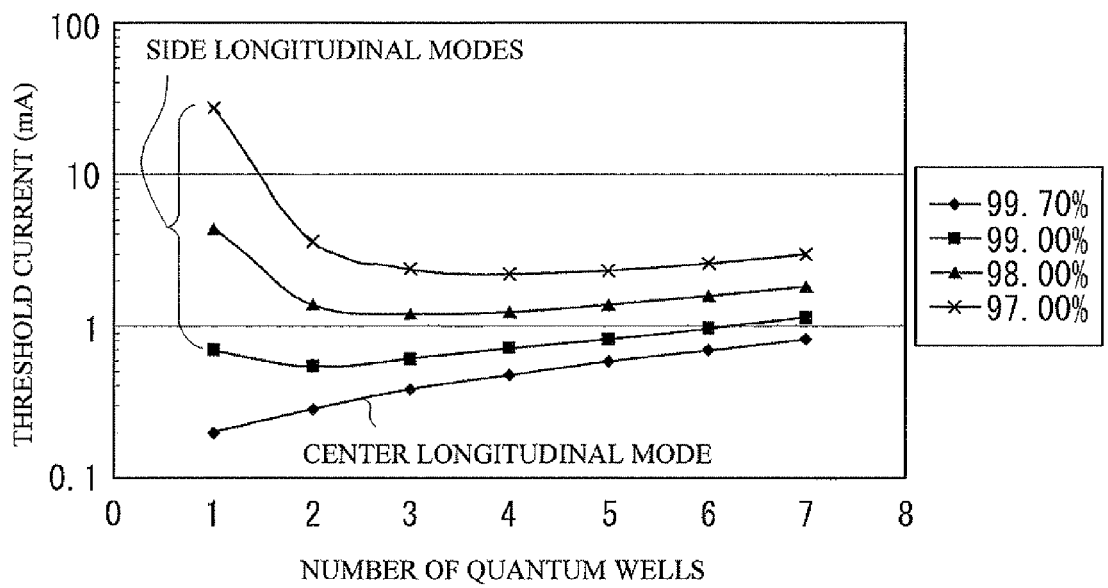
FIG. 8 is a graph that illustrates a relation between a threshold current and the number of quantum wells in a VCSEL with an extended cavity in accordance with a third exemplary embodiment of the present invention.

FIG. 8 is a graph of a relation between the threshold current and the number of quantum wells in the VCSEL with the extended cavity configured according to the first exemplary embodiment. This relation describes variation in the reflectance of the upper DBR on the emission side. A diamond-like symbol indicates a reflectance of 99.70%, and a symbol ■ indicates a reflectance of 99.00%. A symbol ▲ indicates a reflectance of 98.00%, and a symbol x indicates a reflectance of 97.00%. The diamond-like symbol is the center longitudinal mode, and the other symbols are the side longitudinal modes. It can be seen from FIG. 8 that the threshold currents in the side longitudinal modes starts to increase when the number of quantum wells is two. When the number of quantum wells is one, the differences in the threshold current between the center longitudinal mode and the side longitudinal modes are the greatest. The reflectance of the side longitudinal mode is suppressed most effectively when the number of quantum wells is equal to 1.

Figure 9:
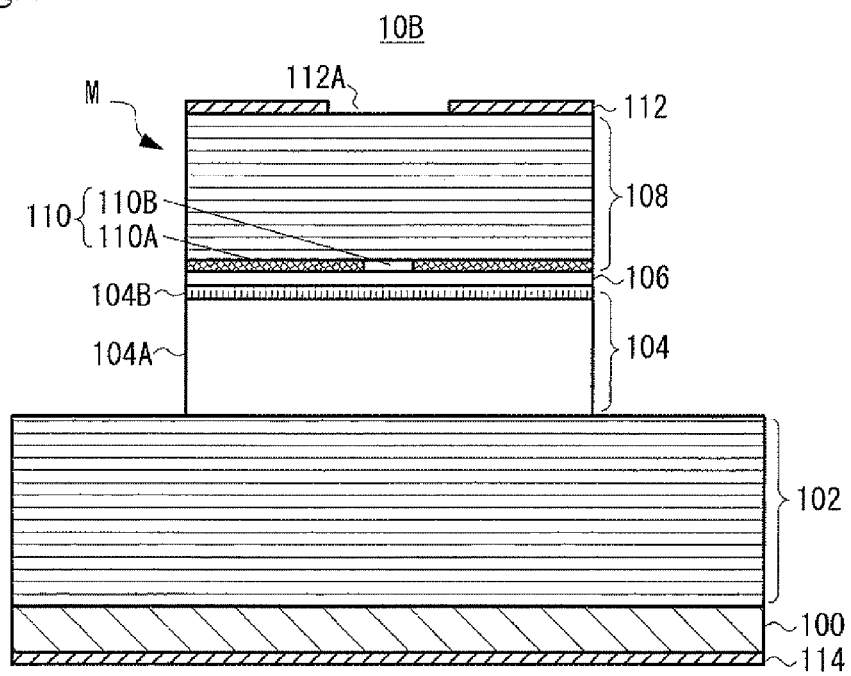
FIG. 9 is a cross-sectional view of a VCSEL having a variation of a cavity extending region employed in the exemplary embodiments.

The above-described exemplary embodiments are exemplary configurations in which the cavity extending region 104 is formed by the single monolithic layer (see FIGS. 1A, 1B, 6A and 6B). The cavity extending region 104 may be varied so that it is composed of multiple layers. A cavity extending region 104 of a VCSEL 10B illustrated in FIG. 9 has a monolithic layer 104A and a carrier block layer 104B. The monolithic layer 104A may be made of AlGaAs, AlAs or GaAs. The carrier block layer 10413 is provided on the monolithic layer 104A and may be made of $Al_{0.9}Ga_{0.1}As$. The carrier block layer 104B has an optical film thickness of $(\lambda/4)mn_{rb}$ where $\lambda$ is the oscillation wavelength, m is an integer, and $n_{rb}$ is the refractive index of the medium. The monolithic layer 104A has an optical film thickness $(\lambda/4)(21-m) n_{rA}$ where $\lambda$ is the oscillation wavelength, 1 is an integer, and $n_{rA}$ is the refractive index of the medium. The carrier block layer 104B close to the active region 106 prevents a carrier leakage from the active region 106.

A description will now be given of a method for fabricating the VCSEL with the extended cavity configured according to the first exemplary embodiment. The following method employs MOCVD (Metal Organic Chemical Vapor Deposition), and sequentially stacks the n-type lower DBR 102, the n-type cavity extending region 104, the active region 106 and the p-type upper DBR 108 on the n-type GaAs substrate 100. Each layer of the lower DBR 102 is formed so as to have a thickness equal to ¼ of the wavelength in the medium. The thickness of the cavity extending region 104 is set equal to 16λ where λ is the wavelength in the medium. The current confining layer 110 is provided on the upper DBR 108 in proximity of the active region 106. The p-type GaAs contact layer is formed on the uppermost layer of the upper DBR 108.

The semiconductor layers on the substrate are etched by a known photolithography process so that the cylindrical mesa M is formed on the substrate. The mesa M has a depth that reaches the lower DBR 102. The mesa M exposes the current confining layer 110. Then, an oxidizing process is carried out to form the oxidized region 110A and the conductive region 110B surrounded by the oxidized region 110A in the current confining layer 110. The diameter of the conductive region 110B is greater than that of the ordinary VCSEL and may be 8 μm or more.

Then, the photolithography process, the ring-shaped p-side electrode 112 is formed on the upper DBR 108. The p-side electrode 112 may be formed on the contact layer of the upper DBR 108 prior to forming the mesa M. An SiON film is formed on the whole surface of the substrate including the mesa M by CVD. Then, the SiON film is etched to form, the anisotropic insulation film on the light emission aperture. After that, the n-side electrode 114 is formed on the back surface of the GaAs substrate 100.

In the above-described exemplary embodiments, the optical film thickness of the cavity extending region 104 is equal to 16λ. This film thickness is an exemplary value and may be selected from the range of 10λ to 20λ. It is to be noted that the number of resonance wavelengths increases proportionally as the cavity length increases. The difference in the refractive index between the high refractive index layer and the low refractive index layer of the upper DBR (which may be the difference in the Al composition) may be selected taking into account the resonance wavelength that takes place. That is, the difference in the refractive index that enables to obtain the reflection band in which the reflectance values at the side resonance wavelengths are reduced.

In the above-described exemplary embodiments, the VCSELs are of selective oxidation type. The current confining layer may be formed by proton ion implantation. In this case, the mesa may be omitted. The above-described exemplary embodiments employ the current confining layers of AlAs. The current confining layer may be made of AlGaAs having an Al composition over 90%. The diameter of the oxide aperture of the current confining layer may be changed taking the desired optical output into consideration. The present invention is not limited to the GaAs-based VCSELs but may include VCSELs of an extended cavity using another III-V compound semiconductor. The above-described exemplary embodiments are the VCSELs having a single spot. The present invention includes a multi-spot VCSEL having multiple spots (light emitting parts) formed on a substrate or a VCSEL array.

Figure 10A:
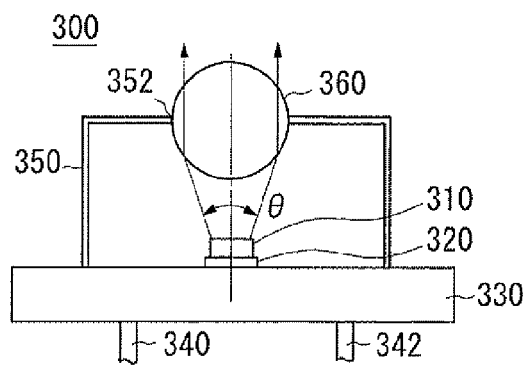
FIG. 10A is a cross-sectional view of a VCSEL device in accordance with an exemplary embodiment of the present invention.

A description will now be given of a surface emitting semiconductor laser device, an optical information processing apparatus and an optical transmission device. FIG. 10A is a cross-sectional view of a VCSEL device in which the VCSEL and an optical component are packaged. A VCSEL device 300 is configured so that a chip 310 on which the VCSEL with the extended cavity is formed is fixed to a disk-shaped metal stem 330 by an electrically conductive adhesive 320. Electrically conductive leads 340 and 342 are inserted into through holes formed in the stem 330. The lead 340 is electrically connected to the n-side electrode of the VCSEL, and the lead 342 is connected to the p-side electrode.

A hollow cap 350 having a rectangular shape is fixed to the stem 330 including the chip 310, and a ball lens 360 of the optical component is fixed within a central aperture 352 of the hollow cap 350. The optical axis of the ball lens 360 is positioned so as to be substantially aligned with the center of the chip 310. A forward voltage is applied between the leads 340 and 342, and a laser beam is emitted from the chip 310 in the vertical direction. The distance between the chip 310 and the ball lens 360 is adjusted so that the ball lens 360 is included within the divergence angle θ of the laser beam with respect to the chip 310. A light receiving element or a temperature sensor for monitoring the emission state of the VCSEL may be provided within the cap.

Figure 10B:
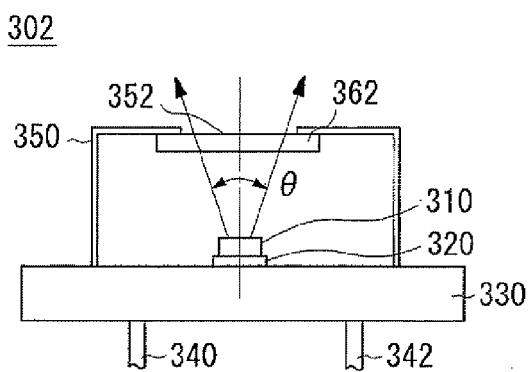
FIG. 10B is a cross-sectional view of a variation of the VCSEL device illustrated in FIG. 10A.

FIG. 10B is a cross-sectional view of another VCSEL device. A VCSEL device 302 does not employ the ball lens 360 but a plate glass 362 in the aperture 352 located at the center of the hollow cap 350. The center of the plate glass 362 is positioned so as to substantially coincide with the center of the chip 310. The distance between the chip 310 and the plate glass 362 is adjusted so that the aperture diameter of the plate glass 362 is equal to or greater than the divergence angle θ of the laser beam with respect to the chip 310.

Figure 11:
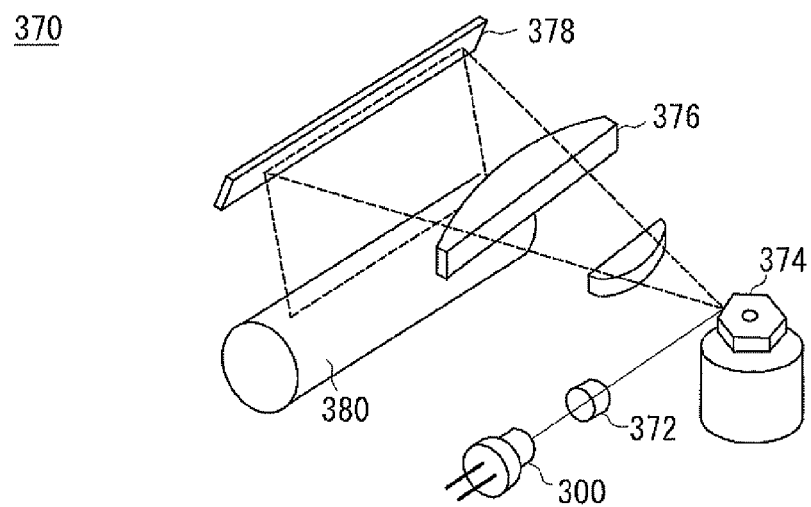
FIG. 11 is a perspective view of an optical information processing apparatus in accordance with an exemplary embodiment of the present invention.

FIG. 11 illustrates an optical information processing apparatus to which the VCSEL is applied as an optical source. An optical information processing apparatus 370 is equipped with the VCSEL device 300 or 302, a collimator lens 372, a polygon mirror 374, an fθ lens 376, a linear reflection mirror 378, and a photosensitive drum (recording medium) 380. The laser beam from the VCSEL device 300 or 302 is incident to the collimator lens 372. The polygon mirror 374 is rotated at a constant velocity, and reflects the optical flux from the collimator lens 372 at the given divergence angle. The fθ lens 376 receives the laser beam from the polygon mirror 374 and projects it onto the reflection mirror 378. A latent image is formed on the photosensitive drum 380 by the reflected light from the reflection mirror 378. The VCSEL device may be applied to an optical information processing apparatus that includes an optical system that collects the laser beam from the VCSEL onto the photosensitive drum, and a mechanism for scanning the photosensitive drum by the collected laser beam, such as a copying machine or a printing machine.

Figure 12:
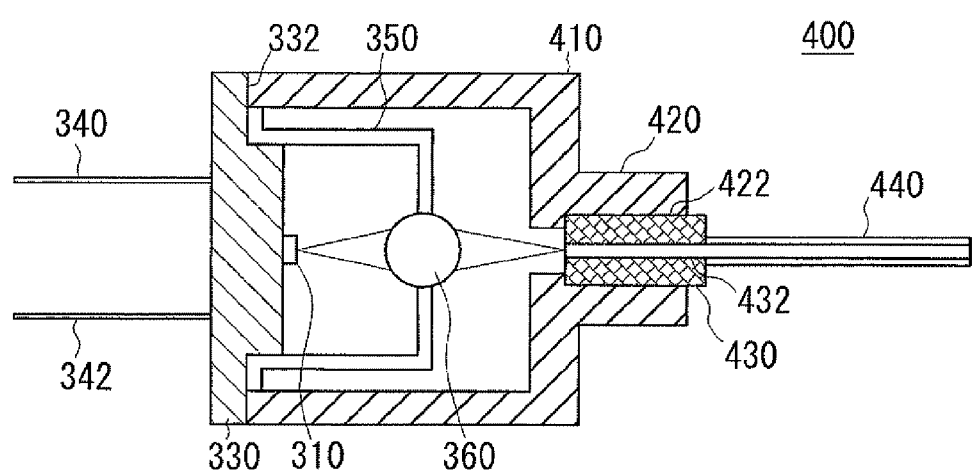
FIG. 12 is a cross-sectional view of an optical transmission device in accordance with an exemplary embodiment of the present invention.

FIG. 12 is a cross-sectional view of an optical transmission device to which the VCSEL device illustrated in FIG. 10A is applied. An optical transmission device 400 illustrated in FIG. 12 has a hollow cylindrical housing 410, a sleeve 420, a ferule 430, and an optical fiber 440. The housing 410 is fixed to the stem 330. The sleeve 420 is formed integrally with an end surface of the housing 410. The ferule 430 is held in an opening 422 of the sleeve 420. The optical fiber 440 is held by the ferule 430. An end of the housing 410 is fixed to a flange 332 formed in the circumferential direction of the stem 330. The optical axis of the optical fiber 440 is aligned with the optical axis of the ball lens 360. The core line of the optical fiber 440 is held in a through hole 432 of the ferule 430.

The laser beam emitted from the surface of the chip 310 is collected by the ball lens 360. The collected light is incident to the core line of the optical fiber 440, and is transmitted. The ball lens 360 used to collect the laser beam in the above-described structure may be replaced by another lens such as a double-convex lens or a plano-convex lens. The optical transmission device 400 may include a drive circuit for applying the electrical signal to the leads 340 and 342. The optical transmission device 400 may include a receiver function for receiving the optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A surface emitting semiconductor laser comprising:
   a substrate;
   a first semiconductor multilayer reflector of a first conduction type that is formed on the substrate and is composed of stacked pairs of relatively high refractive index layers and relatively low refractive index layers;
   a cavity extending region formed on the first semiconductor multilayer reflector;
   an active region formed on the cavity extending region; and
   a second semiconductor multilayer reflector of a second conduction type that is formed on the active region and is composed of stacked pairs of relatively high refractive index layers and relatively low refractive index layers, wherein:
   a cavity including the cavity extending region and the active region has a length greater than an oscillation wavelength, and at least three resonance wavelengths are included in a reflection band of the cavity;
   a difference in refractive index between the relatively high refractive index layers and the relatively low refractive index layers of one of the first and second semiconductor multilayer reflectors that has a smaller reflectance at the at least three resonance wavelengths is smaller than that in refractive index between the relatively high refractive index layers and the relatively low refractive index layers of another one of the first and second semiconductor multilayer reflectors that has a greater reflectance;
   the reflectance at a desired one of the at least three resonance wavelengths of said one of the first and second semiconductor multilayer reflectors that has the smaller reflectance is equal to or greater than 99% and the reflectance at a remaining another resonance wavelength thereof is less than 99%, and
   the reflectance at the desired one and the remaining another resonance wavelengths of said one of the first and second semiconductor multilayer reflectors that has the greater reflectance is equal to or greater than 99%.

2. The surface emitting semiconductor laser according to claim 1, wherein oscillation does not take place at the remaining resonance wavelength.

3. The surface emitting semiconductor laser according to claim 1, wherein the active region includes one or two quantum well layers.

4. The surface emitting semiconductor laser according to claim 1, wherein the cavity extending region includes a single semiconductor layer or multiple semiconductor layers of the first conduction type having a refractive index between the refractive index of the relatively high refractive index layers and that of the relatively low refractive index layers of the first semiconductor multilayer reflector.

5. A surface emitting semiconductor laser comprising:
   a substrate;
   a first semiconductor multilayer reflector of a first conduction type that is formed on the substrate and is composed of stacked pairs of relatively high refractive index layers and relatively low refractive index layers;
   an active region formed on the first semiconductor multilayer reflector;
   a cavity extending region formed on the active region; and
   a second semiconductor multilayer reflector of a second conduction type that is formed on the cavity extending region and is composed of stacked pairs of relatively high refractive index layers and relatively low refractive index layers, wherein:
   a cavity including the cavity extending region and the active region has a length greater than an oscillation wavelength, and at least three resonance wavelengths are included in a reflection band of the cavity;
   a difference in refractive index between the relatively high refractive index layers and the relatively low refractive index layers of one of the first and second semiconductor multilayer reflectors that has a smaller reflectance at the at least two resonance wavelengths is smaller than that in refractive index between the relatively high refractive index layers and the relatively low refractive index layers of another one of the first and second semiconductor multilayer reflectors that has a greater reflectance;
   the reflectance at a desired one of the at least three resonance wavelengths of said one of the first and second semiconductor multilayer reflector is equal to or greater than 99% and the reflectance at a remaining another resonance wavelength thereof is less than 99%, and
   the reflectance at the desired one and the remaining another resonance wavelengths of said one of the first and second semiconductor multilayer reflectors that has the greater reflectance is equal to or greater than 99%.

6. A surface emitting semiconductor laser comprising:
   a substrate;
   a first semiconductor multilayer reflector of a first conduction type that is formed on the substrate and is composed of stacked pairs of relatively high refractive index layers and relatively low refractive index layers;

a cavity extending region formed on the first semiconductor multilayer reflector;

an active region formed on the cavity extending region; and a second semiconductor multilayer reflector of a second conduction type that is formed on the active region and is composed of stacked pairs of relatively high refractive index layers and relatively low refractive index layers, wherein:

a cavity including the cavity extending region and the active region has a length greater than an oscillation wavelength, and at least two resonance wavelengths are included in a reflection band of the cavity;

one of the first and second semiconductor multilayer reflectors that has a smaller reflectance at the at least two resonance wavelengths includes a third semiconductor multilayer reflector composed of stacked pairs of relatively high refractive index layers and relatively low refractive index layers, and a fourth multilayer reflector composed of stacked pairs of relatively high refractive index layers and relatively low refractive index layers; and a difference in refractive index between the relatively high refractive index layers and the relatively low refractive index layers of the third semiconductor multilayer reflector is smaller than that in refractive index between the relatively high refractive index layers and the relatively low refractive index layers of the fourth semiconductor multilayer reflector.

7. A surface emitting semiconductor laser comprising:

a substrate;

a first semiconductor multilayer reflector of a first conduction type that is formed on the substrate and is composed of stacked pairs of relatively high refractive index layers and relatively low refractive index layers;

an active region formed on the first semiconductor multilayer reflector;

a cavity extending region formed on the active region; and a second semiconductor multilayer reflector of a second conduction type that is formed on the cavity extending region and is composed of stacked pairs of relatively high refractive index layers and relatively low refractive index layers, wherein:

a cavity including the cavity extending region and the active region has a length greater than an oscillation wavelength, and at least two resonance wavelengths are included in a reflection band of the cavity;

one of the first and second semiconductor multilayer reflectors that has a smaller reflectance at the at least two resonance wavelengths includes a third semiconductor multilayer reflector composed of stacked pairs of relatively high refractive index layers and relatively low refractive index layers, and a fourth multilayer reflector composed of stacked pairs of relatively high refractive index layers and relatively low refractive index layers; and a difference in refractive index between the relatively high refractive index layers and the relatively low refractive index layers of the third semiconductor multilayer reflector is smaller than that in refractive index between the relatively high refractive index layers and the relatively low refractive index layers of the fourth semiconductor multilayer reflector.

8. The surface emitting semiconductor laser according to claim 6, wherein a difference in the refractive index between the relatively high refractive index layers and the relatively low refractive index layers of the third semiconductor multilayer reflector is smaller than that in the refractive index between the relatively high refractive index layers and the relatively low refractive index layers of one of the first and second semiconductor multilayer reflectors that has a greater reflectance at the at least resonance wavelengths.

9. The surface emitting semiconductor laser according to claim 7, wherein a difference in the refractive index between the relatively high refractive index layers and the relatively low refractive index layers of the third semiconductor multilayer reflector is smaller than that in the refractive index between the relatively high refractive index layers and the relatively low refractive index layers of one of the first and second semiconductor multilayer reflectors that has a greater reflectance at the at least resonance wavelengths.

10. The surface emitting semiconductor laser according to claim 6, wherein the third semiconductor multilayer reflector is located further away from the active region than the fourth semiconductor multilayer reflector.

11. The surface emitting semiconductor laser according to claim 7, wherein the third semiconductor multilayer reflector is located further away from the active region than the fourth semiconductor multilayer reflector.

12. The surface emitting semiconductor laser according to claim 5, wherein oscillation does not take place at the another resonance wavelength.

13. The surface emitting semiconductor laser according to claim 5, wherein the active region includes one or two quantum well layers.

14. The surface emitting semiconductor laser according to claim 6, wherein the active region includes one or two quantum well layers.

15. The surface emitting semiconductor laser according to claim 7, wherein the active region includes one or two quantum well layers.

16. The surface emitting semiconductor laser according to claim 6, wherein the cavity extending region includes a single semiconductor layer or multiple semiconductor layers of the first conduction type having a refractive index between the refractive index of the relatively high refractive index layers and that of the relatively low refractive index layers of the first semiconductor multilayer reflector.

17. The surface emitting semiconductor laser according to claim 5, wherein the cavity extending region includes a single semiconductor layer or multiple semiconductor layers of the second conduction type having a refractive index between the refractive index of the relatively high refractive index layers and that of the relatively low refractive index layers of the second semiconductor multilayer reflector.

18. The surface emitting semiconductor laser according to claim 7, wherein the cavity extending region includes a single semiconductor layer or multiple semiconductor layers of the second conduction type having a refractive index between the refractive index of the relatively high refractive index layers and that of the relatively low refractive index layers of the second semiconductor multilayer reflector.

* * * * *